United States Patent
Morimoto et al.

(10) Patent No.: US 6,768,062 B2
(45) Date of Patent: Jul. 27, 2004

(54) CONNECTION METHOD AND CONNECTION STRUCTURE OF PAD ELECTRODES, AND INSPECTING METHODS FOR CONNECTION STATE THEREOF

(75) Inventors: Ryoichi Morimoto, Shiga-ken (JP); Jitsuho Hirota, Takatsuki (JP); Tatsuya Funaki, Omihachiman (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/973,822

(22) Filed: Oct. 11, 2001

(65) Prior Publication Data

US 2002/0043396 A1 Apr. 18, 2002

(30) Foreign Application Priority Data

Oct. 12, 2000  (JP) ........................................ 2000-312192

(51) Int. Cl.[7] ............................................... H05K 1/16
(52) U.S. Cl. ........................ 174/260; 174/261; 174/267; 361/760; 361/767; 361/772
(58) Field of Search ................................ 174/250, 260, 174/267, 261; 361/760, 764, 767, 768, 772, 773, 774, 783, 777; 257/737, 738, 778, 779, 780

(56) References Cited

U.S. PATENT DOCUMENTS

| | | | |
|---|---|---|---|
| 5,378,859 A | | 1/1995 | Shirasaki et al. |
| 5,484,963 A | | 1/1996 | Washino |
| 5,569,880 A | * | 10/1996 | Galvagni et al. ............ 174/52.4 |
| 5,889,326 A | * | 3/1999 | Tanaka ......................... 257/737 |
| 5,914,536 A | | 6/1999 | Shizuki et al. |
| 5,969,461 A | * | 10/1999 | Anderson et al. ........ 310/313 R |
| 5,973,406 A | | 10/1999 | Harada et al. |
| 5,990,546 A | * | 11/1999 | Igarashi et al. ............. 257/700 |
| 5,998,861 A | * | 12/1999 | Hiruta .......................... 257/700 |
| 6,130,480 A | * | 10/2000 | Ohuchi et al. ............... 257/738 |
| 6,143,992 A | * | 11/2000 | Sato et al. ................... 174/261 |
| 6,204,163 B1 | * | 3/2001 | Panchou et al. ............. 438/613 |
| 6,281,450 B1 | * | 8/2001 | Urasaki et al. .............. 174/261 |
| 6,297,553 B1 | * | 10/2001 | Horiuchi et al. ............. 257/737 |
| 6,330,166 B1 | | 12/2001 | Aoyama et al. |
| 6,426,545 B1 | * | 7/2002 | Eichelberger et al. ....... 257/633 |
| 6,441,316 B1 | * | 8/2002 | Kusui ........................... 174/260 |

FOREIGN PATENT DOCUMENTS

| | | |
|---|---|---|
| JP | 62-32536 | 2/1987 |
| JP | 05-28037 | 4/1993 |
| JP | 06-268018 | 9/1994 |
| JP | 05-243714 | 1/1995 |
| JP | 9-82760 | 3/1997 |
| JP | 9-219583 | 8/1997 |
| JP | 10-74802 | 3/1998 |
| JP | 10-163267 | 6/1998 |
| JP | 11-233936 | 8/1999 |
| JP | 2000-114315 | 4/2000 |

* cited by examiner

*Primary Examiner*—Kamand Cuneo
*Assistant Examiner*—I B Patel
(74) *Attorney, Agent, or Firm*—Burns, Doane, Swecker & Mathis, LLP

(57) ABSTRACT

A connection method and a connection structure, using solder bumps, for component-side pad electrodes and substrate-side pad electrodes, and inspecting methods for the connection state thereof which are adaptable to high density mounting, and which allow the miniaturization of the product formed by mounting a surface-mount component onto a substrate. Substrate-side pad electrodes are arranged inside a component-corresponding region A; the length of the substrate-side pad electrodes is set to be larger than that of the corresponding component-side pad electrode; an IC chip (surface-mount component) is placed on the substrate so that each of the solder bumps is opposed to a predetermined substrate-side pad electrode; and the solder bumps are melted by heating, thereby connecting each of the component-side pad electrodes and one of the substrate-side pad electrodes through the solder.

1 Claim, 7 Drawing Sheets

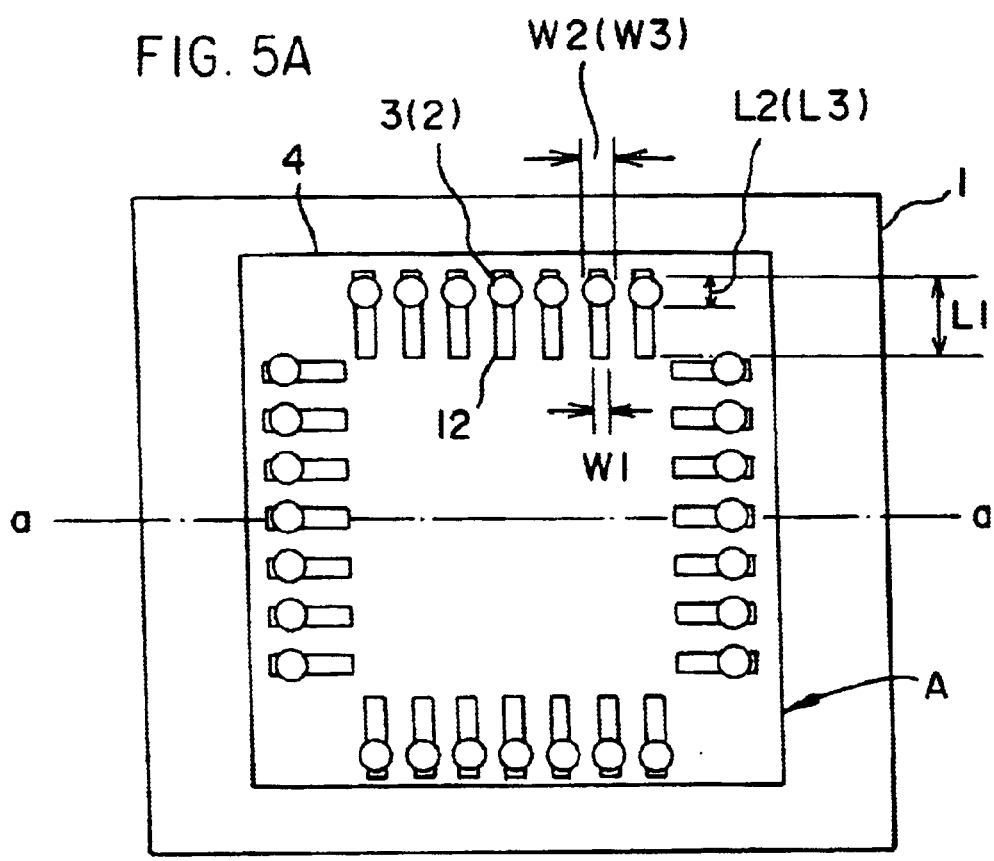
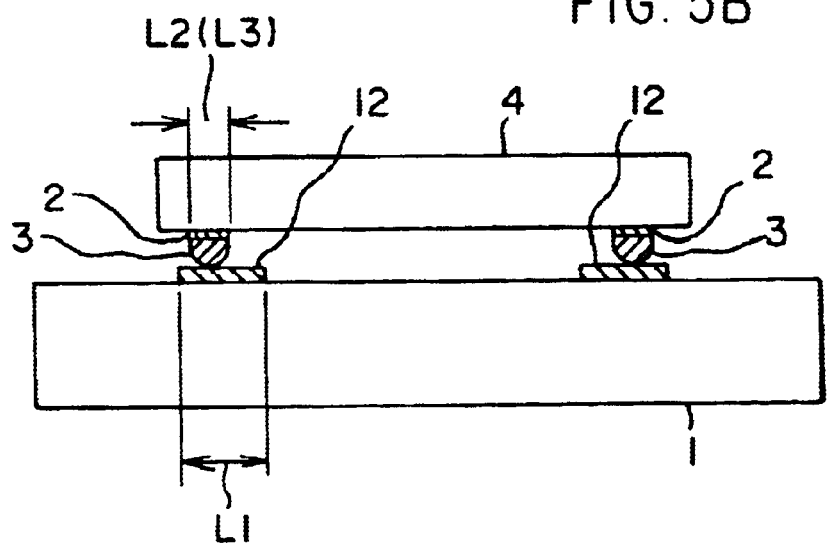

1

CONNECTION METHOD AND CONNECTION STRUCTURE OF PAD ELECTRODES, AND INSPECTING METHODS FOR CONNECTION STATE THEREOF

This application is related and claims priority under 35 U.S.C. §119 to Japanese Patent Application No. 2000-312192, filed Oct. 12, 2000, the entire contents of which are incorporated by reference herein.

BACKGROUND OF THE INVENTION

1. Field of the Invention

The present invention relates to a connection method, a connection structure, and inspecting methods for the connection state when pad electrodes (component-side pad electrodes) formed on a component and pad electrodes (substrate-side pad electrodes) formed on a substrate are each connected by solder bumps.

2. Description of the Related Art

As an example of connection structure for connecting each of the component-side pad electrodes formed on a component and one of the substrate-side pad electrodes formed on a substrate by means of a solder bump, a connection structure as disclosed in Japanese Unexamined Patent Application Publication 9-82760 (see U.S. Pat. No. 5,914,536, an English language patent family member) is known.

As shown in FIGS. 7A and 7B herein, this connection structure is one wherein the semiconductor chip (surface-mount component) 111, in which a plurality of terminal electrodes (component-side pad electrodes) 112 is provided on the bottom surface thereof, is mounted onto a wiring substrate 113, and wherein each of the wiring patterns (substrate-side pad electrodes) 114 provided on the wiring substrate 113 and one of the component-side pad electrodes 112 are electrically connected by a bump (solder bump) 115. In this connection structure, each of bumps 115 is formed of solder 115a, and a metallic core 115b using Cu or the like. The portion (the outer peripheral portion) formed at the outside of the outer edge of the region corresponding to the plan view of the semiconductor chip 111, out of the solder 115a, makes contact with a solder resist 117 formed on the wiring patterns (substrate-side pad electrodes) 114.

In this connection structure, the reflow method is used for mounting a semiconductor chip onto the circuit board 113 of the semiconductor chip 111. Specifically, the connection is performed using the following method.

(1) First, a metallic core 115b is formed on each of the terminal electrodes 112 of the semiconductor chip 111, and a bump 115 is formed by covering the metallic core 115b by solder 115a.

(2) Then, the semiconductor chip 111 is positioned and mounted on the wiring patterns (substrate-side pad electrodes) 114 on the wiring substrate 113, and after the solder 115a of each of the bumps 115 has been melted, the solder 115a is cooled down to solidify it.

In this manner, each of the terminal electrodes 112 and one of the wiring patterns (substrate-side pad electrodes) 114 is connected by a bump 115, and thus the semiconductor chip 111 is mounted onto the wiring substrate 113. Herein, the melted solder 115a flows and spreads over the wiring patterns (substrate-side pad electrodes) 114, which has a good solder wettability, and is stopped by the solder resist 117. Hence, by setting the amount of the solder 115a of the solder bump 115 and the area of the portion which is not covered with the solder resist 117 of the wiring patterns (substrate-side pad electrodes) 114 to an appropriate value, the contact area between the bumps 115 and the wiring patterns (substrate-side pad electrodes) 114 can be made constant, thereby ensuring a stable connection state.

In the above-described conventional connection structure, however, the substrate-side pad electrodes 114 are formed so as to be extended to the outside of the outer edge of the region corresponding to the plan view of the semiconductor chip 111. This makes it difficult to apply this connection structure to the case where surface-mount components such as semiconductor chips are mounted at a high density. In addition, this raises a problem in that the miniaturization of the product which is obtained by mounting semiconductor chips and the like is restricted.

SUMMARY OF THE INVENTION

The present invention has been made to solve the above-described problems. The object of the present invention to provide a connection method and a connection structure, using solder bumps, for component-side pad electrodes and substrate-side pad electrodes, and inspecting methods for the connection state thereof which are adaptable to high density mounting, and which allow the miniaturization of a product formed by mounting a surface-mount component onto a substrate.

In order to achieve the above-described object, the present invention provides a method for connecting each of component-side pad electrodes and one of substrate-side pad electrodes, when a surface-mount component wherein component-side pad electrodes are formed on the surface thereof opposed to a substrate, and wherein solder bumps are formed on the component-side pad electrodes, is mounted onto a substrate, wherein substrate-side pad electrodes are formed on the surface thereof. This method is characterized by comprising arranging the substrate-side pad electrodes inside the region corresponding to the plan view of the surface-mount component (hereinafter, referred to as the "component-corresponding region"); setting the size of each of the substrate-side pad electrodes, in the direction substantially perpendicular to the outer edge of the component-corresponding region (hereinafter, referred to as the "length of substrate-side pad electrodes"), larger than that of the corresponding component-side pad electrode, in the direction substantially perpendicular to the outer edge of the surface-mount component (hereinafter, referred to as the "length of component-side pad electrode"); and placing the surface-mount component on the substrate so that each of the solder bumps are opposed to a predetermined substrate-side pad electrode, and melting the solder bumps by heating, thereby connecting each of the component-side pad electrodes and one of the substrate-side pad electrodes through the solder.

In the connection method for the pad electrodes in accordance with the present invention, the substrate-side pad electrodes are arranged inside the component-corresponding region; the length of each of the substrate-side pad electrodes is set to be larger than that of the corresponding component-side pad electrode; and the surface-mount component is placed on the substrate so that each of the solder bumps are opposed to a predetermined substrate-side pad electrode, and heated to melt the solder bumping. Therefore, the solder which flows and spreads over each of the substrate-side pad electrodes, allows each of the component-side pad electrodes and one of the substrate-side pad electrodes to be connected with reliability.

Also, since each of the substrate-side pad electrodes is formed inside the component-corresponding region, a high-density mounting can be achieved without risk of generating short-circuiting, as well as the miniaturization of the products can be met. Furthermore, the interconnection between the substrate-side pad electrodes and the substrate side can be achieved by connecting to the wiring formed inside the substrate or on the back surface thereof through, for example, via holes or through holes. Thereby, a configuration wherein the substrate-side pad electrodes or wiring are not formed outside the component-corresponding area, can be obtained.

Moreover, since the length of each of the substrate-side pad electrodes is set to be larger than that of each of the component-side pad electrodes, it is possible to make a pass/fail discrimination, with ease and reliability, of the connection state of the pad electrodes by detecting the shapes of the solder (solder bumps) after they have been melted and have connected the pad electrodes, for example, in a nondestructive inspection by X-ray imaging. Specifically, if the solder bumps still have unchanged shapes, it will be recognized that the solder bumps have not yet been melted and flowed, while if the solder bumps have shapes other than the original shapes thereof, it will be recognized that the solder bumps have been melted and flowed, and consequently that each of the component-side pad electrodes and one of the substrate-side pad electrodes are connected by the solder with reliability.

In the present invention, as a substrate, a low-temperature sintered multilayer substrate, a resin substrate, an alumina package, or the like may be used.

When the low-temperature sintered multilayer substrate is used as a substrate, electrodes each formed by plating a thick-film copper electrode with nickel and gold may be used as substrate-side pad electrodes. When the resin substrate is used as a substrate, electrodes each formed by plating a copper foil with nickel and gold may be used as substrate-side pad electrodes. Also, when the alumina package is used as a substrate, electrodes each formed by plating a tungsten electrode with nickel and gold may be used as substrate-side pad electrodes.

However, other types of substrates and/or other types of substrate-side pad electrodes may be employed instead.

In the above-described connection method for the pad electrodes, preferably, the width of each of the component-side pad electrodes and that of the solder bump on each of the component-side pad electrodes are set to be larger than that of each of substrate-side pad electrodes.

By setting the width of each of the component-side pad electrodes larger than that of each of the substrate-side pad electrodes, and by setting the width of the solder bump on each of the component-side pad electrodes larger than that of the substrate-side pad electrode, it becomes possible to increase the flowing-in amount of solder in the longitudinal direction of each of the substrate-side pad electrodes, and thereby to improve the accuracy of a pass/fail discrimination of the connection state between each of the component-side pad electrodes and one of the substrate-side pad electrodes.

An inspecting method for the connection state of the pad electrodes in accordance with the present invention, is a method for inspecting the connection state of the pad electrodes connected by the above-described connection method. This inspecting method is characterized in that the shapes of the solder after each of the solder bumps has been melted and flowed on one of the substrate-side pad electrodes, are detected by a nondestructive inspection, and that thereby a pass/fail discrimination of the connection state between each of the component-side pad electrodes and one of the substrate-side pad electrodes is made.

By detecting the shapes of the solder after each of the solder bumps has been melted and flowed on one of the substrate-side pad electrodes, by a nondestructive inspection, in the above-described connection method for the pad electrodes in accordance with the present invention, it becomes possible to make a pass/fail discrimination, with ease and reliability, of the connection state between each of the component-side pad electrodes and one of the substrate-side pad electrodes by means of solder bumps. This allows the reliability of mounting of surface-mount components to be improved.

Another inspecting method for the connection state of the pad electrodes in accordance with the present invention, is a method for inspecting the connection state of the pad electrodes connected by the above-described connection method. This inspecting method is characterized by comprising the step of obtaining an X-ray transmission image by radiating X rays from the back surface side of the substrate; and the step of detecting the shape of solder after each the solder bumps has been melted and flowed on one of the substrate-side pad electrodes, from the obtained X-ray transmission image, and thereby making a pass/fail discrimination of the connection state between each the component-side pad electrodes and one of the substrate-side pad electrodes.

By obtaining an X-ray transmission image by radiating X-rays from the back surface side of the substrate, and by detecting, from the obtain X-ray transmission image, the shapes of the solder after each of the solder bumps has been melted and flowed, a pass/fail discrimination of the connection state between each of the component-side pad electrodes and one of the substrate-side pad electrodes by means of solder bumps, can be made with ease and reliability. This enables the reliability of mounting of surface-mount components to be improved.

The connection structure between the pad electrodes in accordance with the present invention is a connection structure between each of component-side pad electrodes formed on the surface of a surface-mount component opposed to the substrate and one of substrate-side pad electrodes formed on the surface of the substrate. This connection structure between the pad electrodes is characterized in that the substrate-side pad electrodes are arranged inside a component-corresponding region, and that the length of each of the substrate-side pad electrodes is set to be larger than that of the corresponding component-side pad electrode; and that each of the component-side pad electrodes is connected to the corresponding substrate-side pad electrode by the melted solder bump flowed therein.

In the above-described connection structure between the pad electrodes, since the substrate-side pad electrodes are formed inside the component-corresponding region, short-circuiting among electrodes of surface-mount components does not occur even when surface-mount components are mounted at a high density. Also, since the length of each of the substrate-side pad electrodes is set to be larger than that of the corresponding component-side pad electrode, it is possible to make a pass/fail discrimination of the connection state between the pad electrodes by detecting the shapes of solder after the solder bumps have been melted and flowed, for example, in a nondestructive inspection by X-ray imaging.

In the connection structure between the pad electrodes in accordance with the present invention, preferably, the width of each of the component-side pad electrodes is set to be larger than that of each of substrate-side pad electrodes.

By setting the width of each of the component-side pad electrodes larger than that of each of the substrate-side pad electrodes, it becomes possible to make the width of the solder bump of each of the of the component-side pad electrodes larger than that of the substrate-side pad electrode, when forming a solder bump on each of the component-side pad electrodes. This allows the flowing-in amount of solder in the longitudinal direction of each of the substrate-side pad electrode to be increased, and thereby enables the accuracy of a pass/fail discrimination of the connection state between each of the component-side pad electrodes and one of the substrate-side pad electrodes to be improved. Herein, the above-described connection structure between the pad electrodes can be obtained by the above-described connection method for the pad electrodes in accordance with the present invention.

The above and other objects, features, and advantages of the present invention will be clear from the following detailed description of the preferred embodiments of the invention in conjunction with the accompanying drawings.

BRIEF DESCRIPTION OF THE DRAWINGS

FIGS. 1A and 1B illustrate views each showing a state wherein an IC chip is placed on a substrate in a process by a connection method for the pad electrodes in accordance with a first embodiment of the present invention, wherein FIG. 1A is a transparent plan view, and FIG. 1B is a sectional view taken along the line a—a in FIG. 1A;

FIGS. 2A and 2B illustrate views each showing a state wherein an IC chip is placed on a substrate and subjected to reflow soldering in a process by a connection method for the pad electrodes in accordance with the first embodiment of the present invention, wherein FIG. 2A is a transparent plan view, and FIG. 2B is a sectional view taken along the line a—a in FIG. 2A;

FIGS. 3A and 3B illustrate views each showing a state wherein an IC chip is placed on a substrate and subjected to reflow soldering in a process by a connection method for the pad electrodes in accordance with the first embodiment of the present invention, wherein FIG. 3A is a transparent plan view, and FIG. 3B is an X-ray transmission image of the X-ray radiated region B in FIG. 3A;

FIGS. 4A and 4B illustrate views each showing a state wherein an IC chip is placed on a substrate and subjected to reflow soldering in a process by a connection method for the pad electrodes in accordance with the first embodiment of the present invention, wherein FIG. 4A is a transparent plan view, and FIG. 4B is an X-ray transmission image of the X-ray radiated region B in FIG. 4A;

FIGS. 5A and 5B illustrate views each showing a state wherein an IC chip is placed on a substrate in a process by a connection method for the pad electrodes in accordance with a second embodiment of the present invention, wherein FIG. 5A is a transparent plan view, and FIG. 5B is a sectional view taken along the line a—a in FIG. 5A;

FIGS. 6A to 6C illustrate views each showing a state wherein an IC chip is placed on a substrate and subjected to reflow soldering in a process by a connection method for the pad electrodes in accordance with the second embodiment of the present invention, wherein FIG. 6A is a transparent plan view, FIG. 6B is an X-ray transmission image of the X-ray irradiated region B1 in FIGS. 6A, and 6C is an X-ray transmission image of an X-ray irradiated region B2 in FIG. 6A; and FIGS. 7A and 7B illustrate views each showing the connection configuration of conventional pad electrodes, wherein FIG. 7A is a plan view, and FIG. 7B is a sectional view taken along the line a—a in FIG. 7A.

DESCRIPTION OF THE PREFERRED EMBODIMENTS

First Embodiment

Figure 1A:
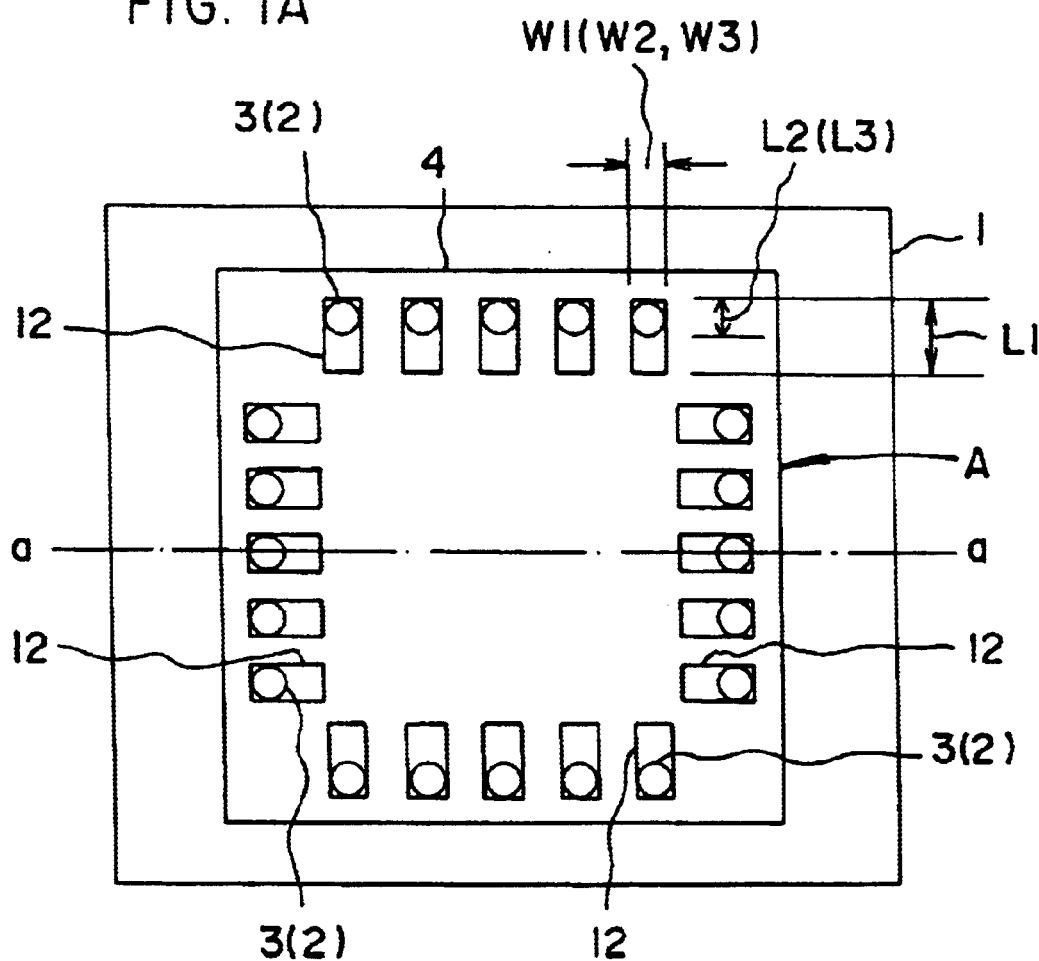

In this first embodiment, a method for connecting each substrate-side pad electrodes 12 and a component-side pad electrode 2 will be described below, taking as an example the case where, as shown in FIGS. 1 and 2, the component-side pad electrodes 2 are formed on a surface opposite to a substrate 1, and an IC chip (surface-mount component) 4, wherein solder bumps 3 are formed on the component-side pad electrodes 2 thereof, is mounted on the substrate 1, wherein the substrate-side pad electrode 12 thereof are formed on the surface thereof.

Figure 1B:
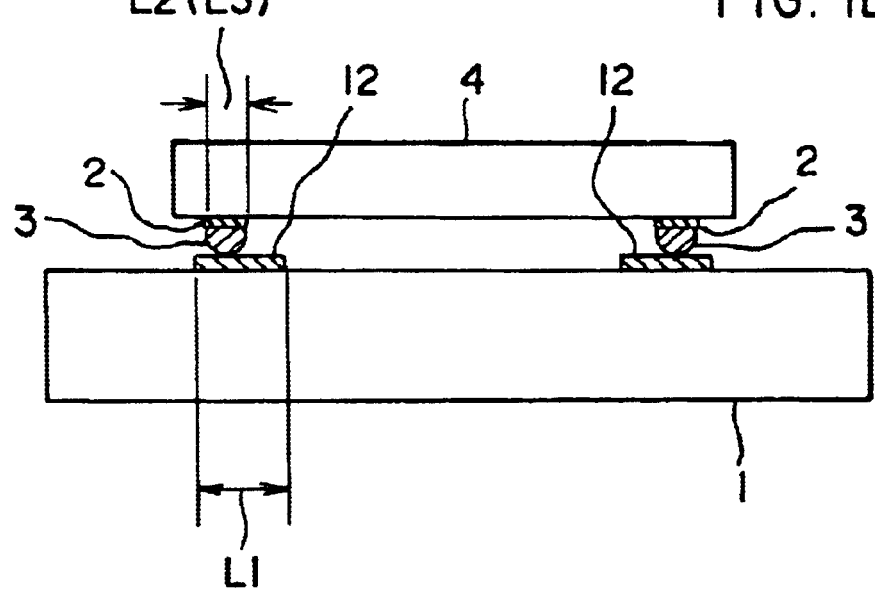
Figure 2A:
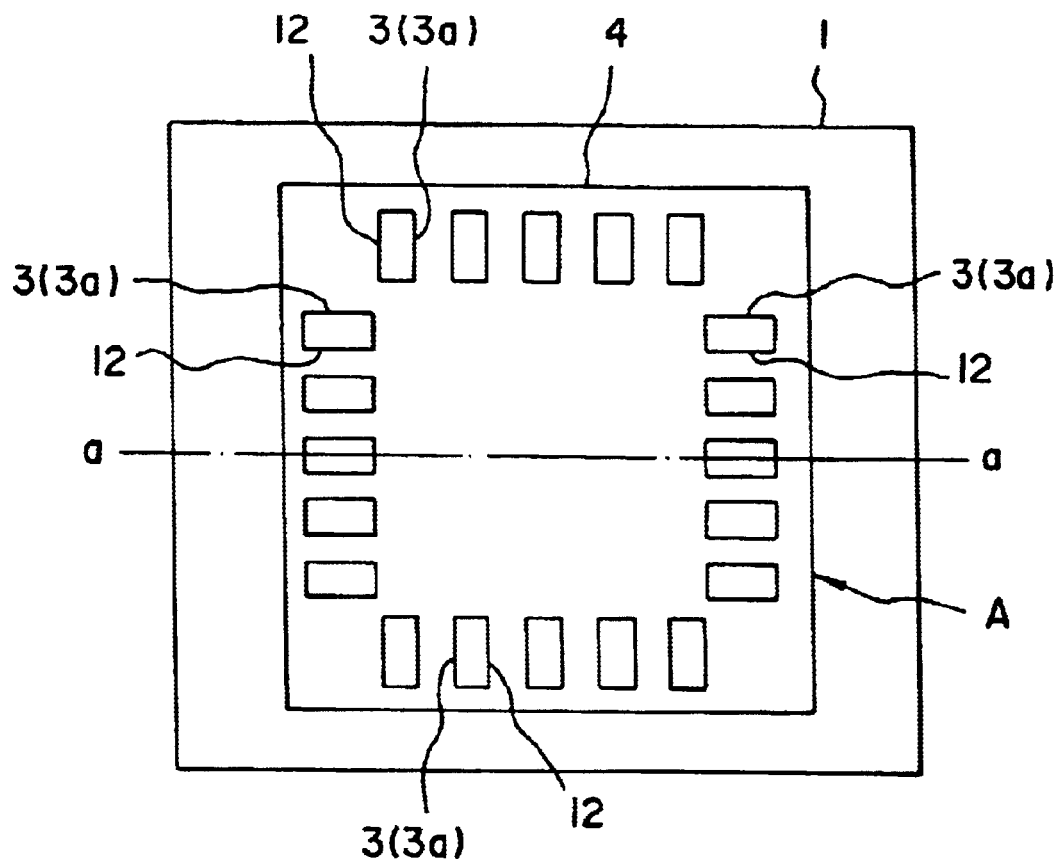
Figure 2B:
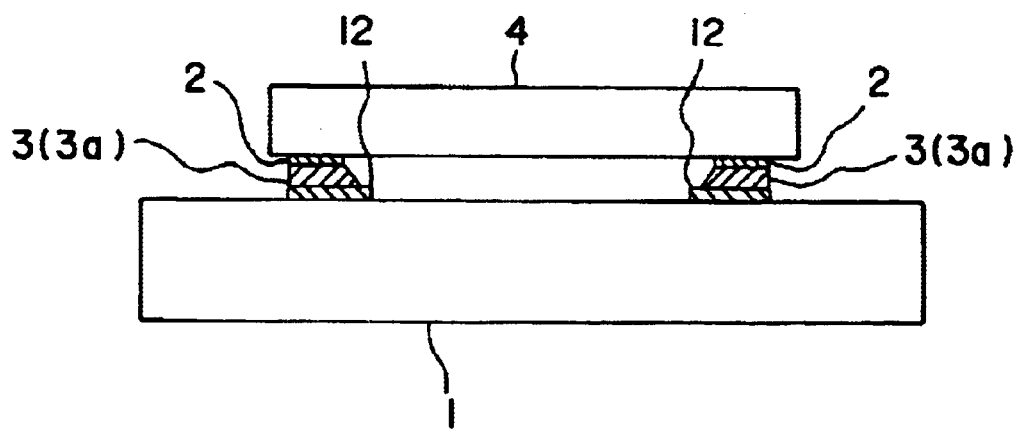

Here, FIGS. 1A and 1B are views showing the IC chip 4 placed on the substrate 1, wherein FIG. 1A is a transparent plan view, and FIG. 1B is a sectional view taken along the line a—a in FIG. 1A. FIGS. 2A and 2B are views showing a state after reflowing, wherein FIG. 2A is a transparent plan view, and FIG. 2B is a sectional view taken along the line a—a in FIG. 2A.

Configurations of substrate-side pad electrodes and component-side pad electrodes As shown in FIGS. 1 and 2, in this embodiment 1, the substrate-side pad electrodes 12 are arranged inside the region (component-corresponding region) A corresponding to the plan view of the IC chip 4 on the substrate 1, and the size (length) L1 of each of the substrate-side pad electrodes 12, in the direction substantially perpendicular to the outer edge of the component-corresponding region A, is set to be larger than the size (length) L2 of the corresponding component-side pad electrode, in the direction substantially perpendicular to the outer edge of the IC chip 4.

Specifically, in the first embodiment, each of the substrate-side pad electrodes 12 is an electrode of a rectangular shape in a plan view, having a width W1 of 0.1 mm, and a length L1 of 0.2 mm, while each of the component-side pad electrodes 2 is an electrode of a circular shape in a plan view, having a diameter (=length L2=width W2) of 0.1 mm. That is, the relation L1>L2 holds. The width W3 and the length L3 of each of the bumps 3 formed on the component-side pad electrodes 2 are each 0.1 mm, as well.

Meanwhile, in the first embodiment, although each of the substrate-side pad electrodes 12 has a rectangular shape in a plan view, and each of the component-side pad electrodes 2 has a circular shape in a plan view, other shapes may be used instead for both of the substrate-side pad electrode and the component-side pad electrode. For example, the shape of the component-side pad electrode in a plan view may be a regular polygon shape instead of a circular shape, and that of the substrate-side pad electrode in a plan view may be an oval or elliptic shape instead of a rectangular shape.

Mounting of IC chip (connection between component-side pad electrodes and substrate-side pad electrodes)

Next, the method will be described for connecting each of the component-side pad electrodes 2 and one of the substrate-side pad electrodes 12 when the IC chip (surface-mount component) 4 is mounted onto the substrate 1.

(1) First, as shown in FIGS. 1A and 1B, the IC chip 4 is positioned so that the solder bump 3 on each of the component-side pad electrodes 2 thereof is opposed to the corresponding substrate-side pad electrode 12, and placed on the substrate 1.

(2) Then, the substrate 1 is put into a reflow furnace in its entirety, and the solder bumps 3 are melted by heating to a predetermined temperature. Thereby, as shown in FIGS. 2A and 2B, the solder bumps 3 are melted to the solder 3a flow, and spread over the surfaces of the substrate-side pad electrodes 12.

(3) Thereafter, by solidifying the solder 3a, each of the component-side pad electrodes 2 and one of the substrate-side pad electrodes 12 are electrically and mechanically connected by the solder 3a, as shown in FIGS. 2A and 2B, and thus the IC chip 4 is mounted onto the substrate 1.

Inspecting method for connection state between component-side pad electrodes and substrate-side pad electrodes Next, a method for inspecting the connection state between each of the component-side pad electrodes 2 and one of the substrate-side pad electrodes 12 connected in the above-described manner, will be described.

(1) First, X-rays are irradiated from the back surface side of the substrate 1, and thereby the transmission images as shown in FIGS. 3A, 3B, and FIGS. 4A and 4B, are obtained.

(2) Then, the shapes of the solder 3a which has flowed by melting the solder bumps 3, are detected from the obtained X-ray images, and thereby a pass/fail discrimination (determination) of the connection state between each of the component-side pad electrodes 2 and the substrate-side pad electrodes 12 by the solder bumps 3 (solder 3a) is made.

Figure 3A:
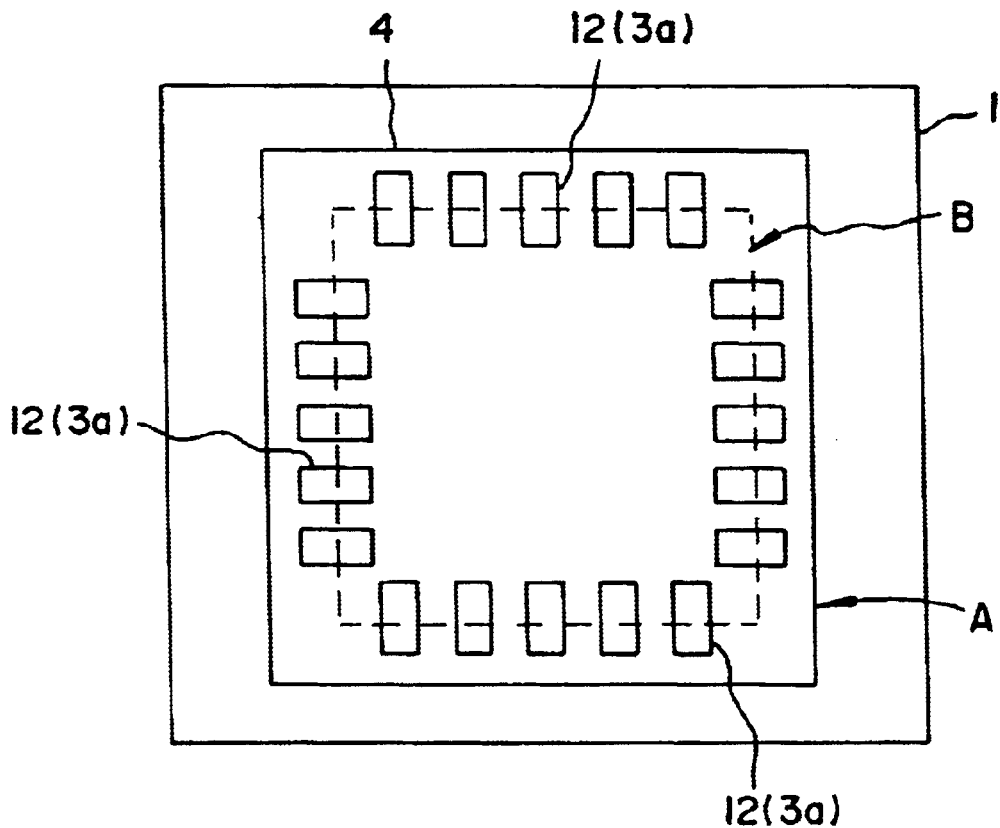
Figure 3B:
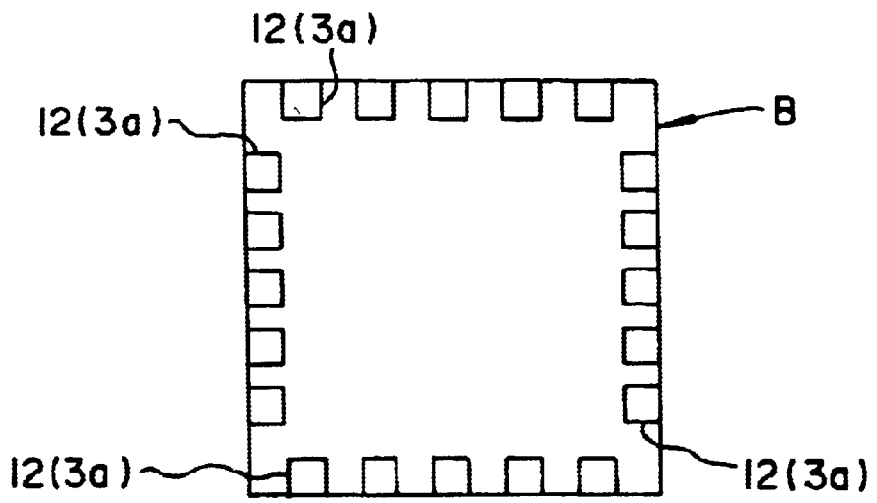
Figure 4A:
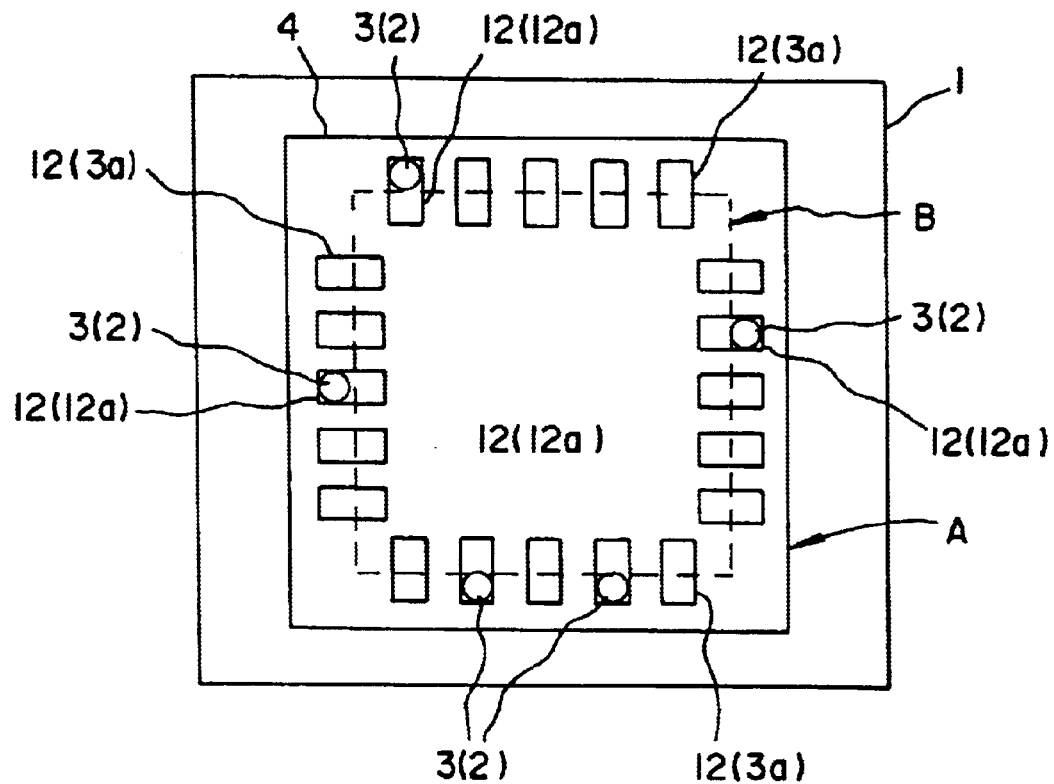
Figure 4B:
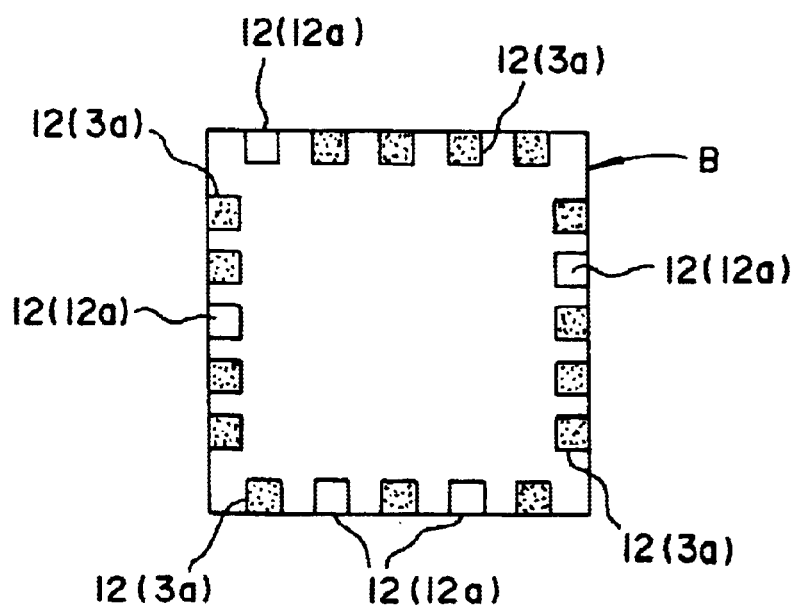

Here, FIGS. 3A and 4A are each transparent plan views, and FIGS. 3B and 4B are each X-ray transmission images of the X-ray irradiated region B in FIGS. 3A and 4A.

As shown in FIG. 3B, if the melted solder 3a has flowed and spread over the entire surfaces of all substrate-side pad electrode 12, all of the plural component-side pad electrodes 2 will be judged to have been connected to the substrate-side pad electrodes 12 through the melted solder bumps 3 (solder 3a).

On the other hand, as shown in FIG. 4B, if substrate-side pad electrodes 12 (12a) wherein the solder bumps 3 thereof have not spread over the entire surfaces of all substrate-side pad electrode 12 after having been melted, are detected among all substrate-side pad electrodes, the connection state between such substrate-side pad electrodes 12 (12a) and component-side pad electrodes 2 will be judged as being a failed one.

More specifically, after reflowing, if the melted solder 3a has not spread over the entire surfaces of all substrate-side pad electrodes 12, the X-ray non-transmission portion of the X-ray transmission image will assume substantially a circular shape, while if the melted solder 3a has spread over the entire surfaces of all substrate-side pad electrodes 12, the X-ray non-transmission portion of the X-ray transmission image assumes substantially the same shape as that of the substrate-side pad electrode 12. Let's take a look now at the region B. With regard to the substrate-side pad electrode 12 (12a) wherein the melted solder 3a has not spread over the entire surfaces thereof, no X-ray non-transmission portion is observed, and the region B is recognized as an X-ray transmission portion as a whole, while, with respect to the substrate-side pad electrode 12 wherein the melted solder 3a has spread over the entire surfaces thereof, the region B is recognized as an X-ray non-transmission portion as a whole.

This allows a pass/fail discrimination of the connection state to be easily made.

Meanwhile, in the first embodiment, since each of the substrate-side pad electrodes has a simple rectangular shape in a plan view, the substrate-side pad electrodes can be easily formed using printing process or the like, thereby reducing the cost thereof.

Second Embodiment

Figure 6A:
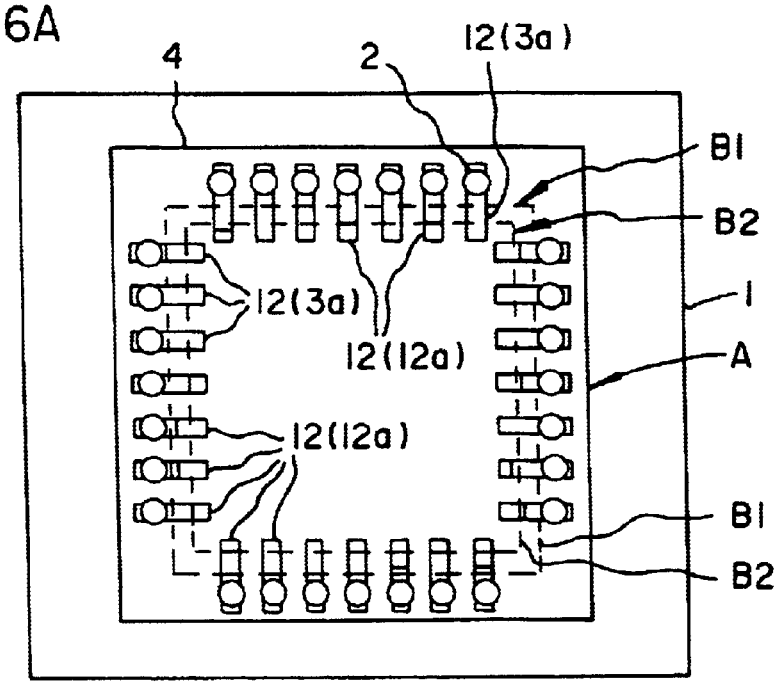
Figure 6B:
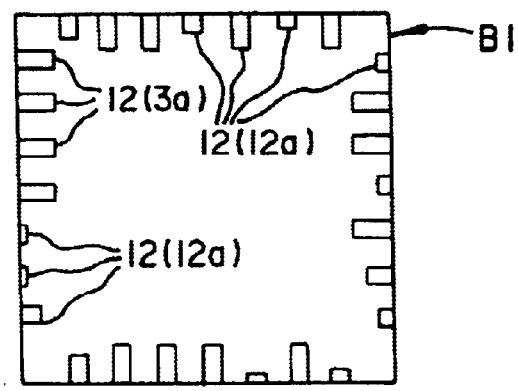
Figure 6C:
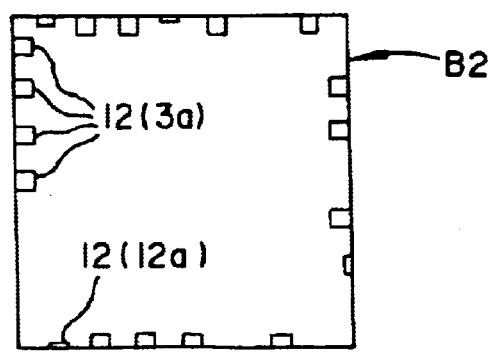
Figure 7A:
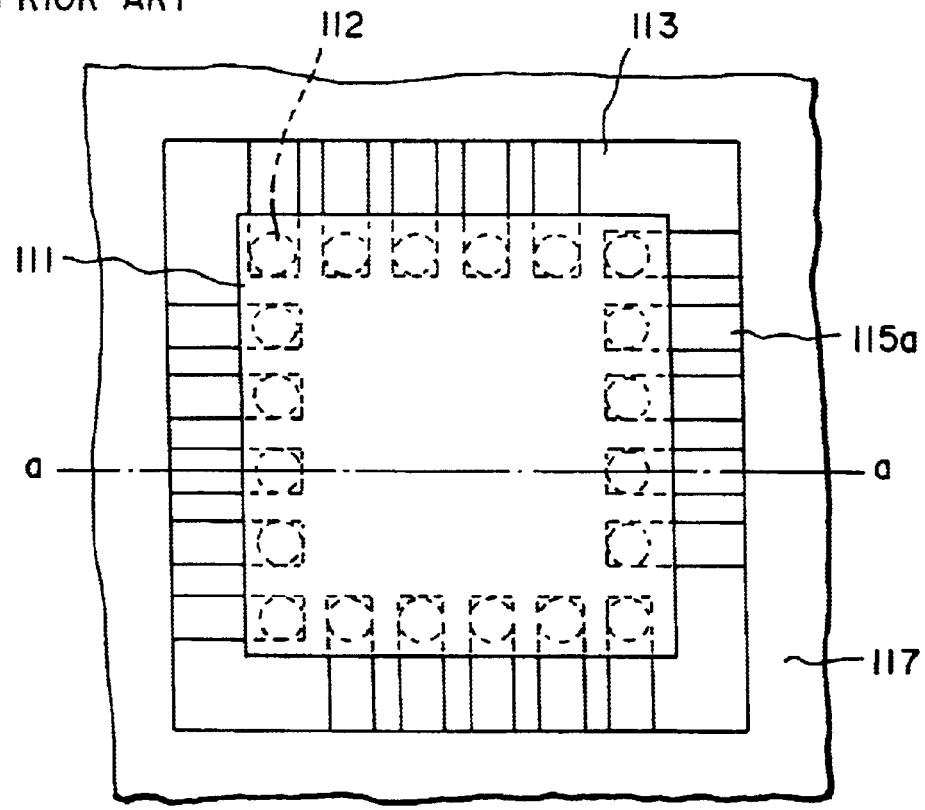
Figure 7B:
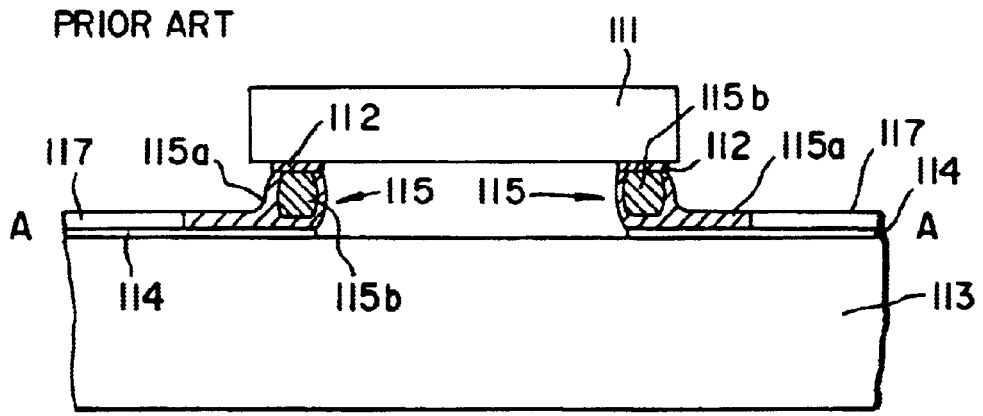

Configurations of substrate-side pad electrodes and component-side pad electrodes FIGS. 5A and 5B are views showing a state in which an IC chip 4 is placed on a substrate in a process by a connection method for the pad electrodes in accordance with another embodiment (a second embodiment) of the present invention, wherein FIG. 5A is a transparent plan view, and FIG. 5B is a sectional view taken along the line a—a in FIG. 5A. FIGS. 6A to 6C are views showing a state after reflowing, wherein FIG. 6A is a transparent plan view, FIG. 6B is an X-ray transmission image of the X-ray irradiated region B1, and 6C is an X-ray transmission image of the X-ray irradiated region B2.

As shown in FIGS. 5A and 5B, in the second embodiment, the substrate-side pad electrodes 12, each being of a rectangular shape in a plan view and having a width W1 of 0.05 mm and a length L1 of 0.2 mm, are arranged so as to extend on the inside of the region (component-corresponding region) A corresponding to the plan view of the IC chip 4. Herein, the size (=length) L1 of each of the substrate-side pad electrodes 12 in the direction substantially perpendicular to the outer edge of the component-corresponding region A is set to be larger than the size L2 of the corresponding component-side pad electrode 2 in the direction substantially perpendicular to the outer edge of the IC chip 4, that is, the diameter (=length) of the component-side pad electrode 2 of a circular shape in a plan view, having a diameter of 0.1 mm.

In the second embodiment, the width W2 and the length L2 (=diameter) of each of the component-side pad electrodes 2 are each set to 0.1 mm, and the width W3 and the length L3 of each of the solder bumps 3 are each set to 0.1 mm in the same manner as the width W2 and the length L2 of each of the component-side pad electrodes 2. On the other hand, the width W1 of each of the substrate-side pad electrodes 12 is set to 0.05 mm. That is, the width W2 of each of the component-side pad electrodes 2 and the width W3 (=W2) of each of the solder bumps 3 are set to be larger than the width W1 of each of the substrate-side pad electrodes 12.

Other configurations are the same as those of the above-described first embodiment, and hence, description thereof will be omitted here to avoid repetition. In FIGS. 5 and 6, the parts which are given the same reference numerals that in FIGS. 1 to 4 used in description of the first embodiment, refer to the same or equivalent parts.

In the second embodiment, although each of the substrate-side pad electrodes 12 has a rectangular shape in a plan view, and each of the component-side pad electrodes 2 has a circular shape in a plan view, other shapes may be used instead for both of the substrate-side pad electrode and the component-side pad electrode. For example, the shape of the component-side pad electrode in a plan view may be a regular polygon shape instead of a circular shape, and the shape of the substrate-side pad electrode in a plan view may be an oval or elliptic shape instead of a rectangular shape.

Mounting of IC chip (connection between component-side pad electrodes and substrate-side pad electrodes)

Next, the method will be described for connecting each of the component-side pad electrodes 2 and one of the substrate-side pad electrodes 12 when the IC chip (surface-mount component) 4 is mounted onto the substrate 1.

(1) First, as shown in FIGS. 5A and 5B, the IC chip 4 is positioned so that the solder bump 3 on each of the component-side pad electrodes 2 thereof is opposed to the corresponding substrate-side pad electrode 12, and placed on the substrate 1.

(2) Then, the substrate 1 is put into a reflow furnace in its entirety, and the solder bumps are melted by heating to a predetermined temperature. Thereby, as shown in FIG. 6A, the solder bumps 3a are melted to the solder 3 flow, and spread over the surface of the substrate-side pad electrode 12.

(3) Thereafter, by solidifying the solder 3a, each of the component-side pad electrodes 2 and one of the substrate-side pad electrodes 12 is electrically and mechanically connected by the solder 3a, as shown in FIG. 6A, and thus the IC chip 4 is mounted onto the substrate 1.

Inspecting method for connection state between component-side pad electrodes and substrate-side pad electrodes Next, a method for inspecting the connection state between each of the component-side pad electrodes 2 and one of the substrate-side pad electrodes 12 connected in the above-described manner, will be described with reference to FIGS. 6A to 6C. As described above, FIG. 6A is a transparent plan view, FIG. 6B is an X-ray transmission image of the X-ray irradiated region B1, and FIG. 6C is an X-ray transmission image of the X-ray irradiated region B2.

(1) First, X-rays are irradiated from the back surface side of the substrate 1, and thereby the transmission images as shown in FIGS. 6B and 6C, are obtained.

(2) Then, the shapes of the solder 3a which has flowed by melting the solder bumps 3, are detected from the obtained X-ray images (FIGS. 6B and 6C), and thereby a pass/fail discrimination (determination) of the connection state between each of the component-side pad electrodes 2 and one of the substrate-side pad electrodes 12 by the solder bumps 3 (solder 3a) is made.

In the second embodiment, since the width W2 of each of the component-side pad electrodes 2 and the width W3 (=W2) of each of the solder bumps 3 are set to be larger than the width W1 of each of the substrate-side pad electrodes 12, the difference in the shapes of the pad electrodes between the conditions when solder bumps 3 have not been melted and when the solder bumps 3 melted to the solder 3a have flowed, can be enlarged. In addition, the length (length of X-ray non-transmission portion) of the flowing-in portion of the solder bump 3 which has been melted to the solder 3a, onto the surface of each of the substrate-side pad electrodes 12, can be elongated. Specifically, in the second embodiment, since the width W1 of each of the substrate-side pad electrodes 12 is smaller than the size (width) W2 of each of the solder bumps 3, the flowing-in length of the solder 3a is larger than in the case of the first embodiment. This allows a pass/fail discrimination of the connection state to be made with more reliability.

Furthermore, by narrowing down the region where X-ray transmission images are obtained, from the region B1 in FIG. 6B to the region B2 in FIG. 6C, which is narrower than the region B1, the substrate-side pad electrodes 12 (12a) wherein the melted solder 3a has not spread over the entire surface thereof, comes to be recognized as an X-ray transmission region substantially as a whole, with only a slight X-ray non-transmission region recognized. As a consequent, it becomes possible to identify the substrate-side pad electrodes 12 wherein the melted solder 3a has spread over the entire surface thereof, thereby allowing a pass/fail discrimination of the connection state to be easily made.

Having a configuration as the above-described second embodiment is particularly useful in the case where surface-mount components, wherein the arranging pitch of component-side pad electrodes is small, are mounted, since such a configuration allows the occurrence of short-circuiting to be prevented.

In the above-described first and second embodiments, descriptions have been made taking the case where the surface-mount component is an IC chip, as an example. However, the present invention may be widely applied to the cases where each of the component-side pad electrodes are connected to one of the substrate-side pad electrodes for mounting a surface-mount component other than an IC chip.

In other respects also, the present invention is not limited to the above-described first and second embodiments. With respect to the structure and material of the substrate, the particular shape, size, and material of the component-side pad electrode and substrate-side pad electrode, and the configuration and material of the bump, various applications and modifications may be made within the true spirit and scope of the invention.

As is evident from the foregoing, in the connection method for the pad electrodes in accordance with the present invention, the substrate-side pad electrodes are arranged inside the component-corresponding region; the length of each of the substrate-side pad electrodes is set to be larger than that of the corresponding component-side pad electrode; and the surface-mount component is placed on the substrate so that each of the solder bumps are opposed to one of the substrate-side pad electrodes and the solder bumps are melted by heating. Therefore, the solder which flows and spreads over each of the substrate-side pad electrodes allows each of the component-side pad electrodes and one of the substrate-side pad electrodes to be connected with reliability.

Also, the substrate-side pad electrodes are formed inside the component-corresponding region, and hence, even when attempting to mount surface-mount components at high density, a high-density mounting can be achieved without generating short-circuiting, thereby allowing the miniaturization of the products to be met.

Furthermore, since the length of each of the substrate-side pad electrodes is larger than that of each of the component-side pad electrodes, it becomes possible to make a pass/fail discrimination of the connection state of the pad electrodes by detecting the shapes of solder (solder bumps) after being melted and connected the pad electrodes, for example, in a nondestructive inspection by X-ray imaging.

Moreover, as in the connection method for the pad electrodes in accordance with the present invention, by setting the width of each of the component-side pad electrodes larger than that of each of the substrate-side pad electrodes, and by setting the width of the solder bump on each of the component-side pad electrodes larger than that of the substrate-side pad electrode, the flowing-in amount of solder in the longitudinal direction of the substrate-side pad electrode can be increased, thereby improving the accuracy of a pass/fail discrimination of the connection state between each of the component-side pad electrodes and one of the substrate-side pad electrodes.

In an inspecting method for the connection state of the pad electrodes in accordance with the present invention, since, after the connection of the pad electrodes, the shapes of the solder after the solder bumps have been melted and flowed over the substrate-side pad electrodes, are detected by a nondestructive inspection method, it is possible to make a pass/fail discrimination, with ease and reliability, of the connection state between each of the component-side pad electrodes and one of the substrate-side pad electrodes by means of solder bumps, without risk of destroying the surface-mount component.

In another inspection method for the connection state of the pad electrodes in accordance with the present invention, since X-rays are irradiated from the back surface side of the substrate to obtain an X-ray transmission image, and the shapes of the solder after the solder bumps have been melted and flowed, are detected from the obtain X-ray transmission image, a pass/fail discrimination of the connection state between each of the component-side pad electrodes and one of the substrate-side pad electrodes by means of solder bumps, can be made with ease and reliability, thereby allowing the reliability of mounting of surface-mount components to be improved.

In the connection structure between the pad electrodes in accordance with the present invention, since the substrate-side pad electrodes are formed inside the component-corresponding region, short-circuiting among electrodes of surface-mount components does not occur even when surface-mount components are mounted at a high density. Also, since the length of each of the substrate-side pad electrodes is set to be larger than that of the corresponding component-side pad electrode, it becomes possible to make a pass/fail discrimination of the connection state between each of the component-side pad electrodes and one of the substrate-side pad electrodes, by detecting the shapes of the solder after the solder bumps have been melted and flowed, for example, in a nondestructive inspection by X-ray imaging.

As in the connection structure between the pad electrodes in accordance with the present invention, by setting the width of each of the component-side pad electrodes larger than that of each of the substrate-side pad electrodes, it becomes possible to make the width of the solder bump of each of the component-side pad electrodes larger than that of the substrate-side pad electrode, when forming a solder bump on each of the component-side pad electrodes. Thereby, the flowing-in amount of solder in the longitudinal direction of each of the substrate-side pad electrode can be increased, resulting in an improved accuracy of a pass/fail discrimination of the connection state between each of the component-side pad electrodes and one of the substrate-side pad electrodes.

While the present invention has been described with reference to what are at present considered to be the preferred embodiments, it is to be understood that various changes and modifications may be made thereto without departing from the invention in its broader aspects and therefore, it is intended that the appended claims cover all such changes and modifications that fall within the true spirit and scope of the invention. Each of the aforementioned documents are incorporated by reference herein in its entirety.

What is claimed is:

1. A connection structure comprising:

a substrate having a surface and substrate-side pad electrodes formed on the substrate surface;

a surface-mount component having a surface, component-side pad electrodes formed on the surface, and a solder bump formed on the component-side pad, the surface being opposed to the substrate with each component-side pad electrode opposed to one of the substrate-side pad electrodes;

wherein the substrate-side pad electrodes are arranged inside a component-corresponding region, the length of each of the substrate-side pad electrodes being larger than that of the corresponding component-side pad electrode, and wherein each of the component-side pad electrodes is connected to the corresponding substrate-side pad electrode by a solder which has flowed between the component-side pad electrodes and the substrate-side pad electrodes by melting of the solder bump, and the solder bump is arranged so that a center of the solder bump is located off-set from a center of the substrate-side pad.

* * * * *